United States Patent
Lisart et al.

(10) Patent No.: US 8,946,859 B2
(45) Date of Patent: Feb. 3, 2015

(54) DEVICE FOR DETECTING AN ATTACK IN AN INTEGRATED CIRCUIT CHIP

(75) Inventors: Mathieu Lisart, Aix en Provence (FR); Alexandre Sarafianos, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 202 days.

(21) Appl. No.: 13/523,599

(22) Filed: Jun. 14, 2012

(65) Prior Publication Data

US 2012/0320477 A1 Dec. 20, 2012

(30) Foreign Application Priority Data

Jun. 17, 2011 (FR) ...................................... 11 55342

(51) Int. Cl.
| | | |
|---|---|---|
| *H01L 21/70* | (2006.01) | |
| *H01L 23/00* | (2006.01) | |
| *H01L 21/763* | (2006.01) | |
| *H01L 23/58* | (2006.01) | |
| *H01L 27/092* | (2006.01) | |

(52) U.S. Cl.
CPC ............ *H01L 23/576* (2013.01); *H01L 21/763* (2013.01); *H01L 23/585* (2013.01); *H01L 27/0921* (2013.01); *H01L 2924/0002* (2013.01)

USPC .......... 257/547; 257/48; 257/503; 257/E21.63; 361/78

(58) Field of Classification Search
None
See application file for complete search history.

(56) References Cited

U.S. PATENT DOCUMENTS

| | | | |
|---|---|---|---|
| 4,862,240 A | 8/1989 | Watanabe et al. | |
| 6,010,939 A | 1/2000 | Bothra | |
| 2005/0276127 A1* | 12/2005 | Takeuchi | ................. 365/189.09 |
| 2006/0180939 A1 | 8/2006 | Matsuno | |
| 2009/0251168 A1 | 10/2009 | Lisart et al. | |
| 2010/0187525 A1 | 7/2010 | Bartley et al. | |
| 2011/0012195 A1 | 1/2011 | Momota et al. | |
| 2011/0169560 A1 | 7/2011 | Ito | |
| 2012/0320480 A1* | 12/2012 | Lisart et al. | ..................... 361/88 |
| 2013/0154023 A1 | 6/2013 | Yoshida et al. | |

* cited by examiner

*Primary Examiner* — Sonya D McCall Shepard
(74) *Attorney, Agent, or Firm* — Seed IP Law Group PLLC

(57) ABSTRACT

An integrated circuit chip including a plurality of parallel wells of alternated conductivity types formed in the upper portion of a semiconductor substrate of a first conductivity type, and a device of protection against attacks including: between the wells, trenches with insulated walls filled with a conductive material, said trenches extending from the upper surface of the wells to the substrate; and a circuit capable of detecting a modification of the stray capacitance formed between said conductive material and a region of the chip.

19 Claims, 5 Drawing Sheets

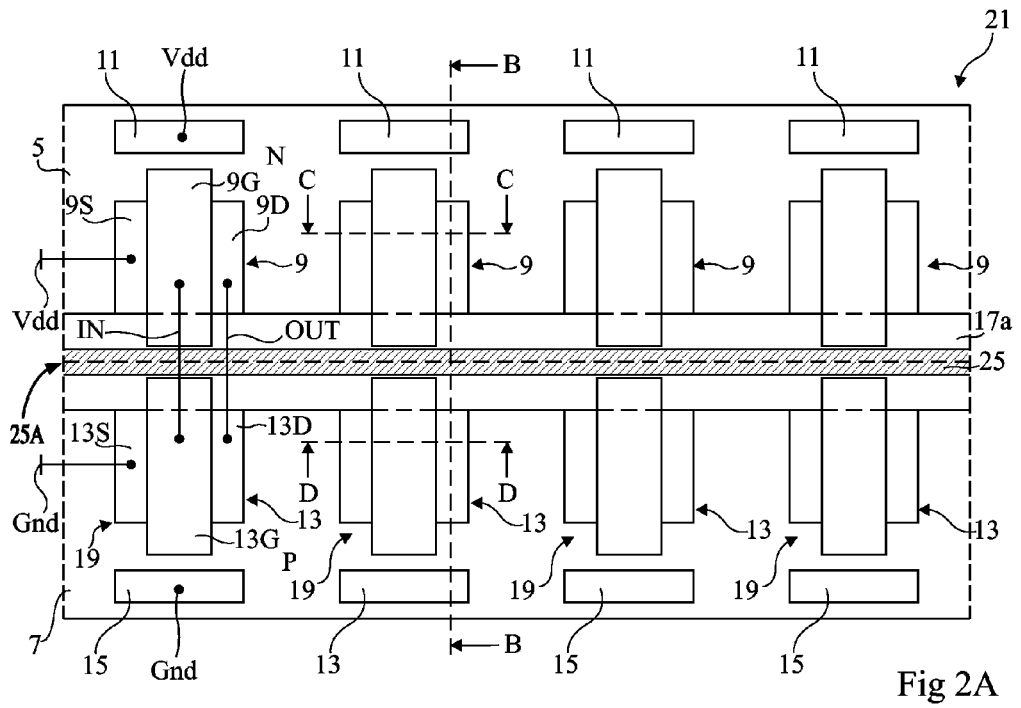
Fig 2A
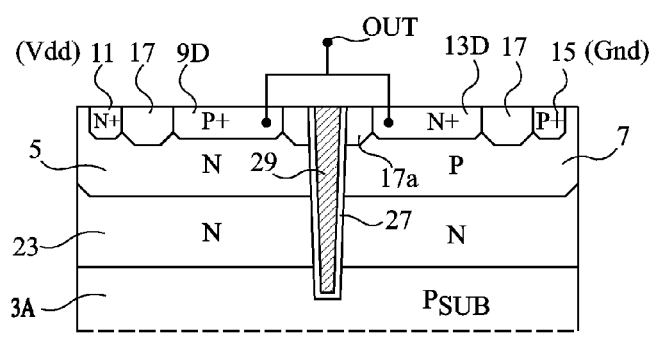
Fig 2B
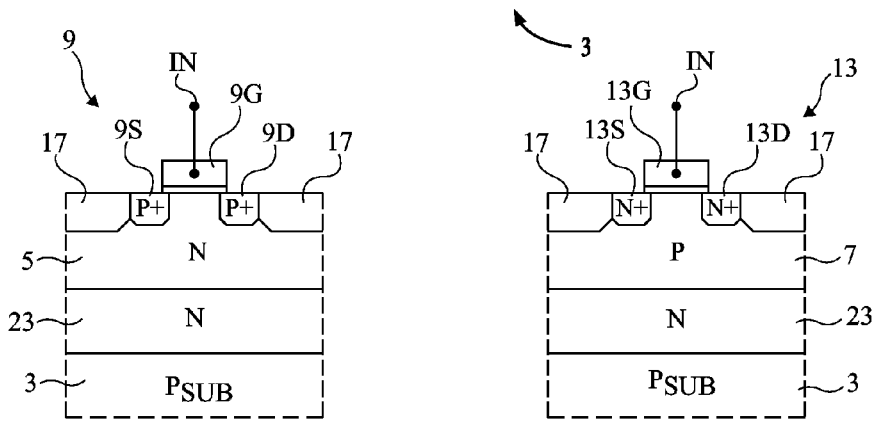
Fig 2C
Fig 2D

DEVICE FOR DETECTING AN ATTACK IN AN INTEGRATED CIRCUIT CHIP

BACKGROUND

1. Technical Field

The present disclosure relates to the protection of an integrated circuit chip against attacks aiming at obtaining protected confidential data.

2. Description of Related Art

In certain secure devices such as payment cards, integrated circuits chips are likely to process and/or store critical data, for example, encryption keys. Such chips may be fraudulently manipulated to obtain protected confidential data.

Among known attacks, so-called "fault injection attacks" comprise intentionally disturbing the chip operation and analyzing the influence of the disturbances on its behavior. The attacker especially examines the influence of the disturbances on data such as output signals, the consumption, or response times. He is likely to infer from it, by statistic studies or the like, critical data such as algorithms implemented by the chip, and possibly encryption keys.

To intentionally cause anomalies in the circuits of a chip, an attack mode comprises bombarding chip areas with a laser beam while the chip is operating. Faults can thus be injected into certain memory cells and/or affect the behavior of certain components. Due to the presence of interconnection metal tracks on the front surface side of the substrate, laser attacks are most often carried out on the back side of the chip. The attacker generally provides a preliminary step of thinning of the chip substrate, to decrease the beam attenuation by the substrate, and thus improve the efficiency of the attack.

To avoid frauds, chips comprising an attack detection device coupled with a chip protection circuit have been provided. When an attack is detected, the protection circuit implements measures of protection, alienation, or destruction of the critical data. For example, it may be provided, when an attack is detected, to interrupt the power supply of the chip or to cause its resetting, to minimize the time during which the attacker can study the chip response to a disturbance.

Attack detection solutions may be logic. They for example comprise regularly introducing into the calculations integrity tests enabling to make sure that data have not been modified. Such solutions have the disadvantage of introducing additional calculation steps, thus increasing the chip response times. Further, integrity tests cannot detect all the disturbances caused by an attacker. The latter thus has room for maneuver to acquire critical data.

Other so-called physical attack detection solutions comprise sensors sensitive to temperature variations, to ultraviolet or X rays, enabling to detect suspicious activities. Like logic solutions, such solutions are not perfectly reliable. Indeed, before the attack detection, the attacker has room for maneuver to obtain critical data. Further, the implementation of such solutions is complex and increases the silicon surface area to form the chip.

Another example of attack comprises locally etching the chip substrate from its back side to reach the active portion of the substrate, that is, the upper layer of the substrate in which the chip transistors are formed. The local etching of the substrate may comprise etching, from the back side, increasingly deep and narrow successive openings, the last openings being formed by means of a focused ion beam (FIB). As an example, the attacker may "open" a substantially circular area having a diameter ranging from a few tens of micrometers to a few hundreds of micrometers, having its bottom at the level of the active portion of the chip. At the end of this step, there only remains a thin substrate thickness, for example, approximately ranging from 0.5 to 1.5 µm, between the bottom of the opening and the stack of insulating layers and of interconnection metal tracks coating the front surface of the substrate. The attacker then forms holes of small diameter, for example, on the order of a few hundreds of nanometers, connecting the bottom of the opening to metal interconnection tracks of the circuit arranged on the front surface side of the substrate, and/or active areas of the circuit such as MOS transistor source or drain regions. The holes are filled with a conductive material such as tungsten to form vias. Contact pads are formed on the bottom of the opening, each pad covering one of the vias. Such an attack thus provides access to signals present in tracks of the first metallization level(s) of the integrated circuit, and/or in active areas of the integrated circuit.

BRIEF SUMMARY

One embodiment is a structure for protecting an integrated circuit chip against attacks, which overcomes at least some of the disadvantages of existing solutions.

One embodiment is a protection device enabling to detect a local etching of the chip substrate, of the type performed in an attack by contact from the back side of the chip.

One embodiment is a protection device further enabling to prevent the injection of faults into the chip circuits, especially by means of a laser.

One embodiment provides an integrated circuit chip comprising a plurality of parallel wells of alternated conductivity types, formed in the upper portion of a semiconductor substrate of a first conductivity type, and a device of protection against attacks, comprising: between the wells, trenches with insulated walls filled with a conductive material, the trenches extending from the upper surface of the wells to the substrate; and a circuit capable of detecting a modification of the stray capacitance formed between said conductive material and a region of the chip.

According to an embodiment, the above-mentioned chip region is selected so that the stray capacitance is modified when the chip substrate is locally etched from its back side.

According to an embodiment, the chip further comprises a layer of the second conductivity type, extending under the plurality of wells, between the lower surface of the wells and the substrate.

According to an embodiment, the depth of the trenches is greater than 2 µm.

According to an embodiment, the conductive material is polysilicon.

According to an embodiment, the circuit comprises an oscillator having a resonance frequency depending on the value of the stray capacitance and means for comparing the resonance frequency with a reference value.

According to an embodiment, the above-mentioned chip region is the chip substrate.

According to an embodiment, the above-mentioned chip region is a bias contacting area of a well of the first conductivity type.

According to an embodiment, the chip comprises, in each well of the first type, a plurality of MOS transistors having a channel of the second conductivity type, and in each well of the second type, a plurality of MOS transistors having a channel of the first type, neighboring transistors of neighboring wells being inverter-connected.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIG. 2A is a top view schematically and partially showing an embodiment of an integrated circuit chip protected against attacks;

FIGS. 2B, 2C, and 2D are cross-section views along planes A-A, B-B, and C-C of FIG. 2A.

DETAILED DESCRIPTION

Figure 1A:
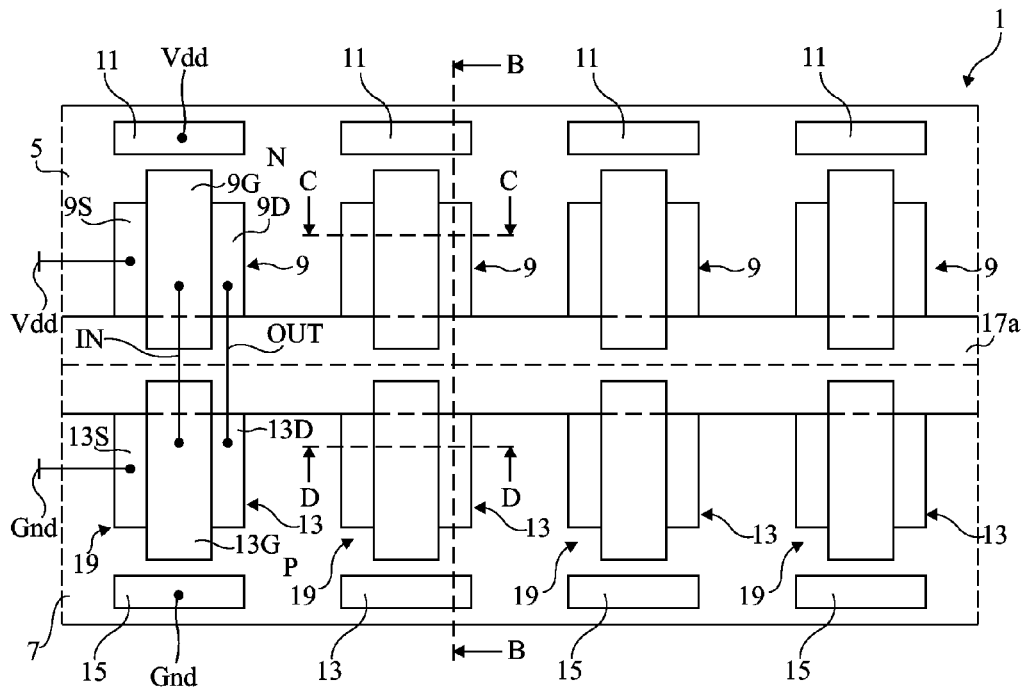
FIG. 1A is a top view schematically and partially showing an embodiment of an integrated circuit chip.

For clarity, the same elements have been designated with the same reference numerals in the different drawings and, further, as usual in the representation of integrated circuits, the various drawings are not to scale.

Figure 1B:
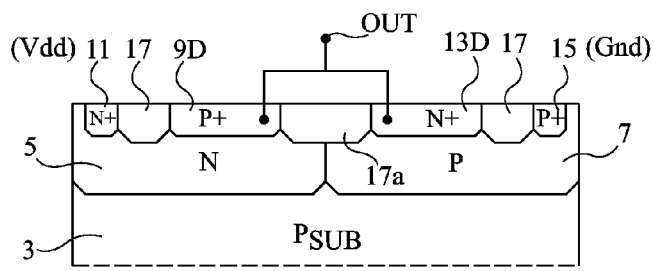
FIGS. 1B, 1C, and 1D are cross-section views along planes A-A, B-B, and C-C of FIG. 1A.
Figure 1C:
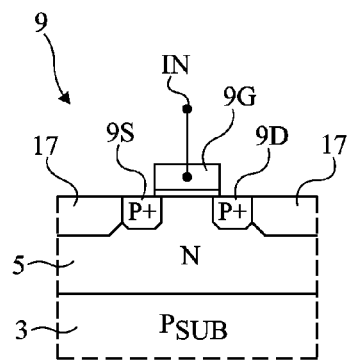
Figure 1D:
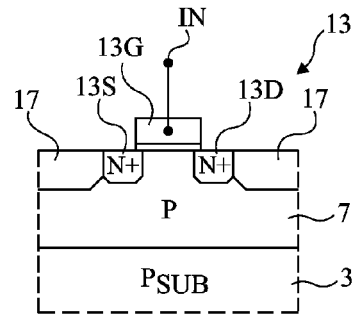

FIGS. 1A to 1D schematically and partially show an embodiment of an integrated circuit chip 1. FIG. 1A is a top view of chip 1, and FIGS. 1B, 1C, and 1D are cross-section views, respectively along planes A-A, B-B, and C-C of FIG. 1A.

Chip 1 is formed from a lightly-doped P-type semiconductor substrate 3 $P_{SUB}$, for example, a silicon substrate. Juxtaposed wells of alternated conductivity types are formed in the upper portion of substrate 3. In this example, only two wells 5 and 7, respectively of type N and of type P, which have in top view the shape of juxtaposed parallel strips (in dotted lines in FIG. 1A), have been shown. In practice, chip 1 may comprise a large number of juxtaposed parallel wells of alternated conductivity types.

N-type well 5 comprises channels of a plurality of P-channel MOS transistors 9. Each transistor 9 comprises heavily-doped P-type source 9S and drain 9D regions (P+), delimited by an insulated conductive gate 9G formed at the surface of well 5. Well 5 further comprises a plurality of heavily-doped N-type regions 11, forming biasing contact areas of the well. In this example, a contact area 11 is arranged in the vicinity of each transistor 9.

P-type well 7 comprises channels of a plurality of N-channel MOS transistors 13. Each transistor 13 comprises heavily-doped N-type source 13S and drain 13D regions (N+), delimited by an insulated conductive gate 13G formed at the surface of well 7. Well 7 further comprises a plurality of heavily-doped P-type regions 15, forming biasing contact areas of the well. In this example, a contact area 15 is arranged in the vicinity of each transistor 13.

Insulating regions 17, 17a are formed in the upper portion of wells 5 and 7 to insulate the transistors from one another and from the contacting areas. In particular, an insulating region 17a having, in top view, the shape of a strip parallel to wells 5 and 7, extends above the junction area between wells 5 and 7, thus insulating transistors 9 from transistors 13. Insulating regions 17 and 17a for example are trenches having a depth approximately ranging from 100 to 300 nm, filled with silicon oxide. Such trenches may be formed according to a method currently designated as STI (Shallow Trench Insulation) in the art.

In chip 1, each transistor 9 of well 5 is, in top view, arranged close to a transistor 13 of well 7. Neighboring transistors 9 and 13 are inverter-connected, that is, gate 9G of transistor 9 is connected to gate 13G of transistor 13, forming the input terminal of an inverter 19, and drain 9D of transistor 9 is connected to drain 13D of transistor 13, forming output terminal OUT of inverter 19. The gate-gate and drain-drain interconnects are formed by conductive tracks, not shown, for example, made of polysilicon or metal. As an example, in operation, source 9S of transistor 9 is at a high power supply voltage Vdd, source 13S of transistor 13 is at a low power supply voltage Gnd, bias contact 11 of well 5 is at high voltage Vdd, bias contact 15 of well 7 is at low voltage Gnd, and substrate 3 is at low voltage Gnd.

Inverters 19 form elementary cells of chip 1. They are interconnected by conductive tracks, not shown, to form blocks implementing functions of the chip.

The present inventors have studied the effects of a bombarding of chip 1 by a laser beam. They have observed the appearance of eddy currents due to the forming of electron-hole pairs at the level of the reverse-biased PN junctions, and especially at the level of the PN junctions between well 5 and well 7 and between substrate 3 and well 5. Such currents are capable of turning on parasitic NPN bipolar transistors formed by areas 11 and well 5 (N), well 7 (P), and drain regions 13D (N); PNP transistors formed by areas 15 and well 7 (P), well 5 (N), and drain regions 9D (P); PNP transistors formed by drain regions 9D (P), well 5 (N), and substrate 3 (P); and PNP transistors formed by source regions 9S (P), well 5 (N), and substrate 3 (P). Parasitic bipolar transistors crossing source regions 9S and 13S of MOS transistors 9 and 13 may also be turned on. This may result in various operating anomalies, for example, logic faults, that is, the value of the signal on output terminal OUT of one or more of the inverters 19 is inverted with respect to the value which should normally be present on this terminal, given the signal applied on input terminal IN. Delay faults may also occur, that is, the switching of the output signal of one or more of the inverters 19 is delayed with respect to a switching in the absence of the laser beam.

FIGS. 2A to 2D schematically and partially show an embodiment of an integrated circuit chip 21 protected against attacks. FIG. 2A is a top view of chip 21, and FIGS. 2B, 2C, and 2D are cross-section views, respectively along planes A-A, B-B, and C-C of FIG. 2A.

Like chip 1 of FIGS. 1A to 1D, chip 21 comprises parallel wells of alternated conductivity types, P-channel MOS transistors being formed in N-type wells and N-channel MOS transistors being formed in the P-type wells. Neighboring transistors of opposite types, formed in wells of opposite conductivity types, are assembled as inverters, forming elementary cells of chip 21. The elements common to chips 1 and 21 have been designated with the same reference numerals in the drawings and will not be described in detail again hereafter.

In chip 21, wells 5 and 7 are laid on an N-type layer 23 which forms an interface between the wells and a lower portion 3A of the substrate 3. As an example, the thickness of wells 5 and 7 ranges between 0.5 and 1.5 µm, and the thickness of layer 23 ranges between 1 and 2 µm. It should be noted that in practice, layer 23 and wells 5, of type N, may form a same N-type region.

Further, in chip 21, parallel wells 5 (of type N) and 7 (of type P) are not juxtaposed like in chip 1 of FIGS. 1A to 1D, but are separated by insulating regions 25 which extend from the upper surface of the wells to N layer 23. Regions 25 form lateral insulation walls, which form an interface between the wells. There thus does not exist, under inverters 19, a lateral PN junction between wells 5 and 7, as in chip 1 described in relation with FIGS. 1A to 1D.

In the shown example, region 25 entirely crosses N-type layer 23 to emerge into the lower portion 3A of the substrate 3. Region 25 may be interrupted or opened in regions separating two inverters 19 of the chip, or in regions comprising no MOS transistors (no interrupt or opening is visible in FIGS. 2A to 2D). Such interrupts enable to guarantee the uniformity of the biasing of layer 23.

In this example, insulating region 25 extends from the upper surface of surface insulating region 17a separating transistors 9 of well 5 from transistors 13 of well 7. In top view (FIG. 2A), insulating region 25 has the shape of a strip, possibly interrupted or opened in certain regions of the chip, parallel to wells 5 and 7, having a smaller width than strip 17a, and substantially coinciding with the central portion of strip 17a. Thus, the provision of insulating region 25 does not increase the semiconductor surface area used to form the chip. In an alternative embodiment, surface insulation region 17a may be omitted.

Insulating region 25 is formed in a trench 25A and includes a film 27 of an insulating material such as silicon oxide coating lateral walls and a bottom of the trench 25A, this trench being filled with a conductive material 29 such as polysilicon. Such a trench may be formed according to a method currently designated as DTI (Deep Trench Insulation) in the art. Any other method capable of forming a lateral insulation trench filled with a conductive material and sufficiently deep to reach substrate 3 may be used.

In FIGS. 2A to 2D, only two parallel wells 5 and 7 have been shown. However, in practice, chip 21 may comprise a large number of parallel wells of alternated conductivity types, separated from one another by lateral insulation regions 25. Thus, in chip 21, transistors 9 and 13 forming a same inverter 19 are separated by an insulating wafer portion 25.

Trials performed by the present inventors have shown that the bombarding of a chip of the type described in relation with FIGS. 2A to 2D by a laser beam causes no operating anomalies. In the presence of the laser beam, a relatively high eddy current, due to the forming of electron-hole pairs at the level of the reverse-biased PN junction formed between the lower portion 3A of the substrate 3 and layer 23, effectively appears in substrate 3. However, such an eddy current has no incidence on the operation of the chip circuits. In particular, due to the presence of layer 23 and of insulating regions 25, no parasitic bipolar transistor is capable of being turned on under the effect of the laser beam. In the case where lateral insulation region 25 comprises openings in certain regions of the chip, there remains, in these regions, lateral PN junctions between wells 5 and 7. However, such junctions have a small surface area and are sufficiently spaced apart from inverters 19 not to enable the injection of faults in circuits of the chip.

Thus, in chip 21, layer 23 and insulating regions 25 are elements of a protection device configured to protect the chip 21 against attacks by preventing consequences of an attack, that is, the injection of faults or operating anomalies into the chip circuits. This contrast with prior art devices that seek to detect an attack, and then to protect, alienate, or destroy the critical data of the chip.

An advantage of the provided protection device is that it enables to protect the chip, not only against laser attacks, but also against other types of attack, for example, fault injection attacks by means of an electromagnetic field.

Another advantage of such a protection device is that it causes no increase of the silicon surface area used to form the chip.

Figure 3:
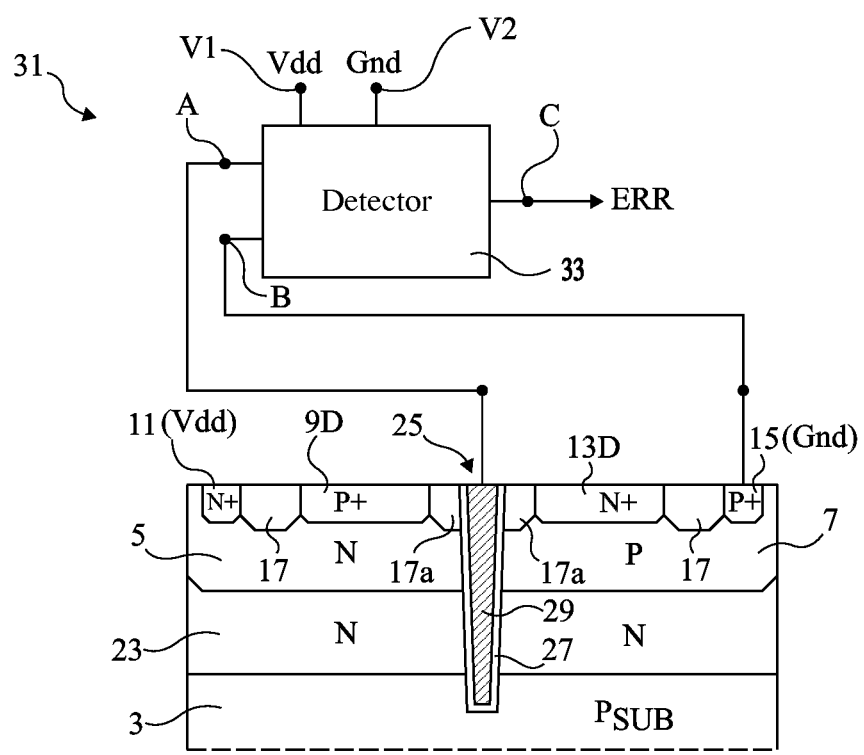
FIG. 3 is a simplified cross-section view of an embodiment of an integrated circuit chip protected against attacks, comprising a device for detecting a local etching of the chip substrate from its back side.

FIG. 3 is a cross-section view in the same plane as FIG. 2B, schematically and partially showing an embodiment of an integrated circuit chip protected against attacks. Chip 31 of FIG. 3 comprises a protection device enabling, not only to prevent the injection of faults, as in chip 21 described in relation with FIGS. 2A to 2D, but also to detect a possible local etching of the substrate from its back side, of the type performed in an attack by contact from the back side of the substrate. Chip 31 comprises the same elements as chip 21 described in relation with FIGS. 2A to 2D, and further comprises a local etching detection circuit 33.

Conductive material 29, filling the trench with insulated walls 27 arranged between neighboring wells 5 and 7, forms an electrode common to a plurality of stray capacitances. In particular, stray capacitances can be observed between material 29 and well 5, between material 29 and well 7, between material 29 and layer 23, and between material 29 and substrate 3. There exist other stray capacitances, for example, at the level of the PN junction between substrate 3 and layer 23, and between well 7 and layer 23.

The local etching of the substrate in an attack by contact from the back side significantly modifies the value of the stray capacitances. Indeed, before being able to take contacts, the attacker must access the back side of wells 5 and 7. He must thus totally remove substrate 3 and N-type layer 23 from the attacked area. Thus, the stray capacitance between material 29 and substrate 3 may totally disappear, and the other capacitances may be strongly decreased.

To detect a local etching of the substrate from the back side, it is here provided to detect a variation of a capacitance having an electrode formed by conductive material 29. It is for example provided to detect a variation of the equivalent capacitance formed between material 29 and substrate 3 of the chip, or between material 29 and a bias contact 11 or 15 of a chip well.

If a capacitance variation capable of corresponding to an attack is detected, various measures may be taken to protect, alienate, or destroy the confidential data of the chip. As an example, a capacitance measurement may be performed each time the chip is powered on, to verify that the substrate has not been etched, or continuously when the chip is powered.

In FIG. 3, circuit 33 has been shown as a block comprising power supply terminals V1 and V2, input terminals A and B, and an output terminal C. In operation, terminals V1 and V2 are respectively connected to high and low power supply voltages Vdd and Gnd. Terminals A and B are respectively connected to two points between which the value of a capacitance is desired to be measured. In this example, terminal A is connected to conductive material 29 filling trench 25, and terminal B is connected to a bias contact area 15 of well 7 juxtaposed to trench 25. Terminal C provides a signal (ERR) having its value depending on the value of the equivalent capacitance between terminals A and B. Signal ERR enables to determine whether substrate 3 of chip 31 has been locally etched around or close to trench 25.

Figure 4:
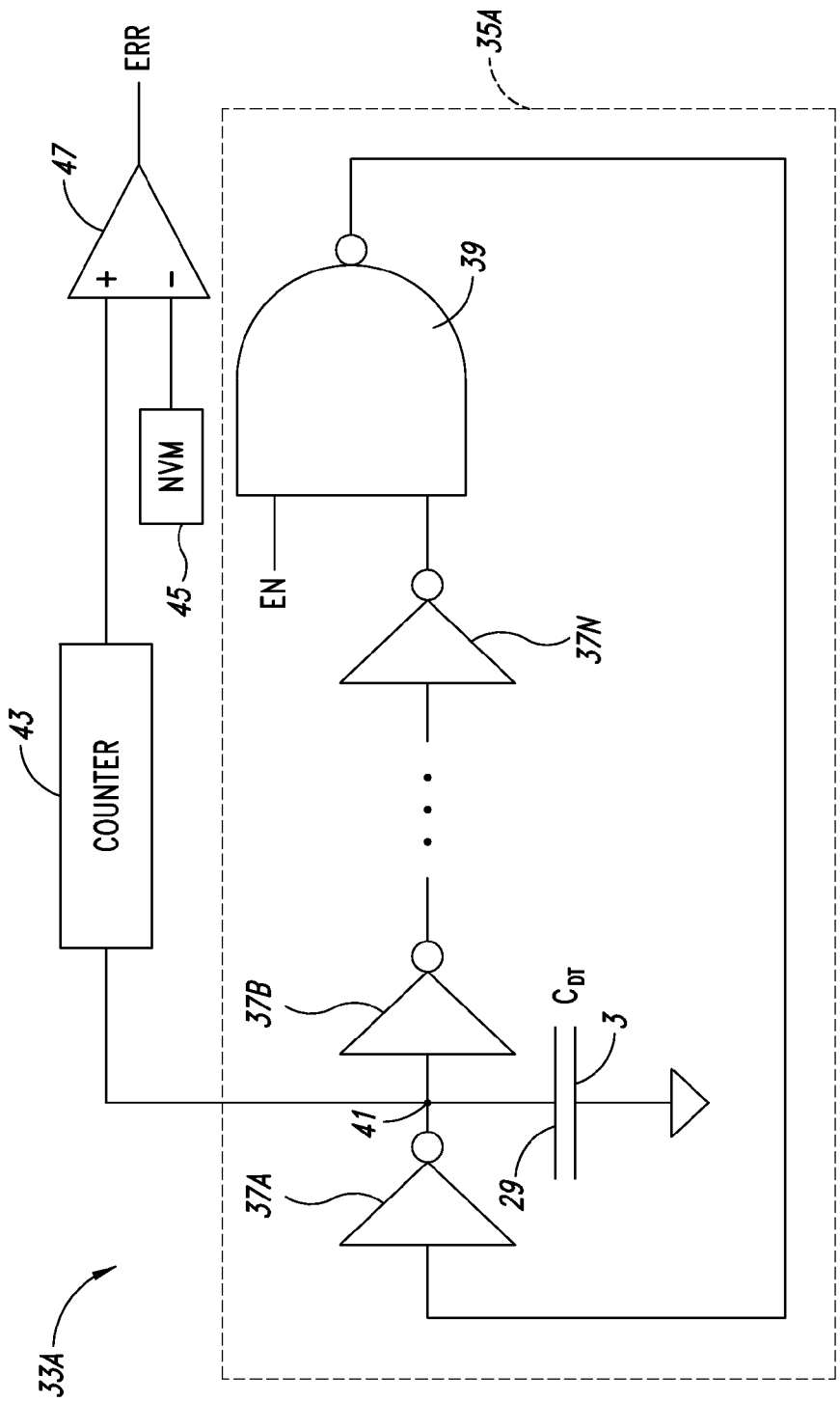
FIG. 4 shows an etching detection circuit according to an embodiment of the present disclosure.

FIG. 4 shows an etching detection circuit 33A according to one embodiment, which can be used as the etching detection circuit 33 of FIG. 3. The etching detection circuit 33A includes a ring oscillator 35A comprising a plurality of CMOS inverters 37A, 37B, . . . 37N coupled to each other, where the output of the last inverter 37N is connected to the input of the first inverter 37A via an enabling NAND gate 39 that has a first input configured to receive an enable signal EN and a second input coupled to the output of the last inverter 37N. An intermediate node 41 common to the first and second inverters 37A, 37B is connected to a first electrode of the capacitance to be measured. The oscillator resonance frequency is linked to the value of the capacitance between terminals A and B.

In the example of FIG. 4, the first electrode is the conductive filling 29 and the capacitance to be measured is the capacitance $C_{DT}$ formed by the conductive filling 29 as the first electrode, the substrate 3 as the second electrode, and the insulating wall 27 as the intermediate dielectric. The detector 33A also includes a counter 43, a non-volatile memory (NVM) register 45, and a comparator 47. An input of the counter 43 is coupled to the intermediate node 41 and to the conductive filling 29 and the output of the counter 43 is coupled to a first input of the comparator 47. A second input of the comparator 47 is coupled to the output of the NVM register 45. The comparator 47 compares the output of the counter 43 with a value stored in the NVM register 45 that corresponds to the expected output of the counter 43 when the chip 31 is operating without attack. An etching of the substrate 3 in the area comprising insulating region 25 increases the resonance frequency of the oscillator 35A, causing the counter 43 to output a value different from the value stored in the NVM register 45, and causing the comparator 47 to output the error signal ERR.

Figure 5:
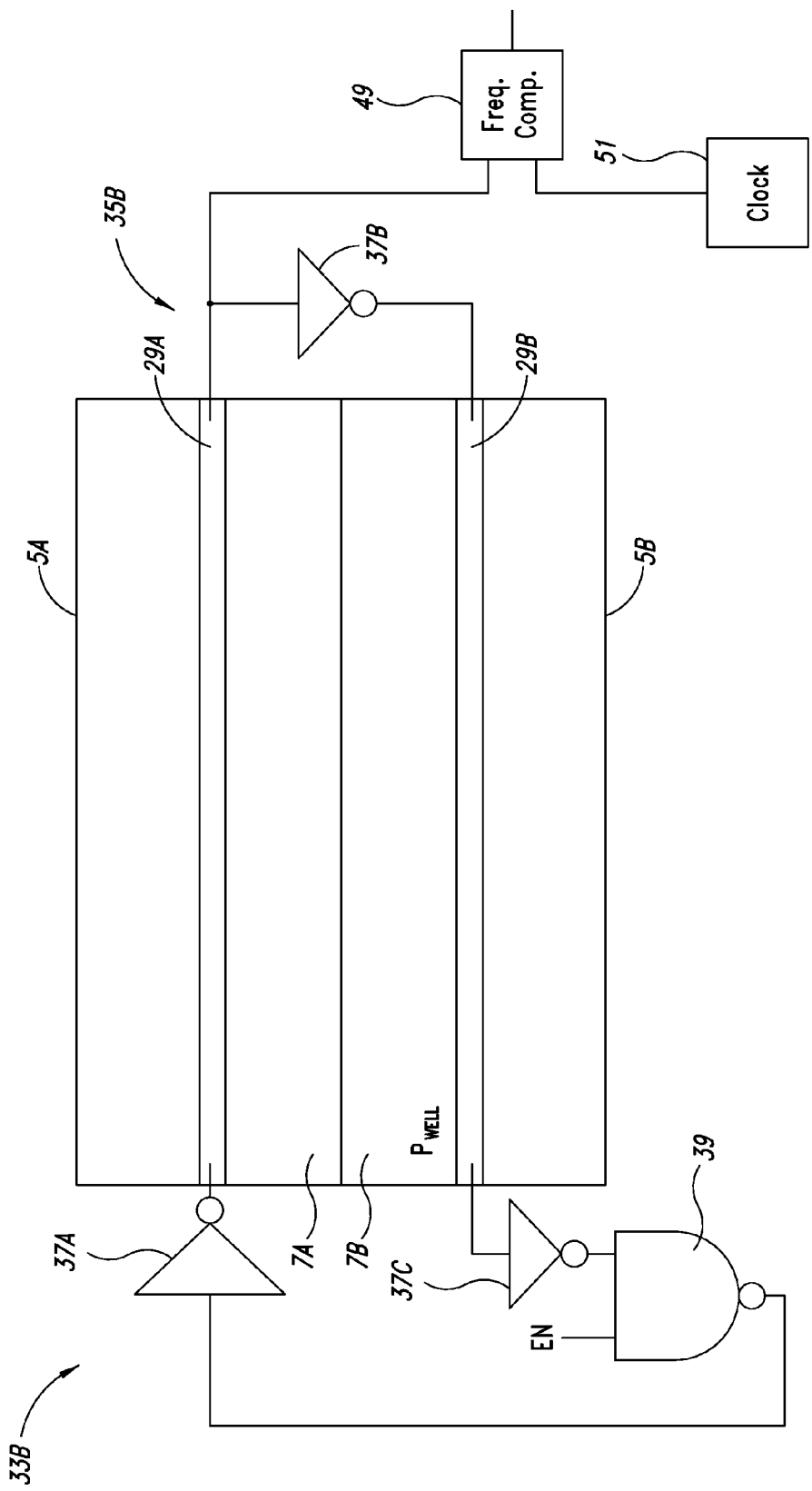
FIG. 5 shows an etching detection circuit according to an embodiment of the present disclosure.

FIG. 5 shows an etching detection circuit 33B according to another embodiment, which can be used as the etching detection circuit 33 of FIG. 3. The etching detection circuit 33B includes an oscillator 35B having a plurality of CMOS inverters 37A, 37B, 37C coupled to each other, where the output of the last inverter 37C is connected to the input of the first inverter 37A via the enabling NAND gate 39 that has a first input configured to receive an enable signal EN and a second input coupled to the output of the last inverter 37C. The first inverter 37A is coupled to the second inverter 37B by the conductive filling 29A of a first insulating region, corresponding to the insulating region 25, between a first N-type well 5A and a first P-type well 7A. The second inverter 37B is coupled to the third inverter 37C by the conductive filling 29B of a second insulating region, corresponding to the insulating region 25, between a second N-type well 5B and a second P-type well 7B. To detect an etching of the substrate 3 at either of the first and second insulating regions, the value of the resonance frequency of the oscillator 35B is measured and compared by a frequency comparator 49 with a reference frequency provided by a clock 51 coupled to the frequency comparator 49.

As a variation, any other type of oscillator having its resonance frequency depending on the capacitance between terminals A and B, for example, an RLC-type oscillator, may be used. More generally, any circuit capable of detecting a variation or a modification of the value of a capacitance may be used, for example, a capacitive dividing bridge.

Several detection circuits 33 may be provided on chip 31. A detection circuit 33 may for example be associated with each region 25 of separation of the chip wells, or with each section of a separation region 25. As a variation, a detection circuit 33 associated with several different regions 25 may be provided. It is also possible to only provide detection circuits 33 in the most critical chip areas. It should be noted that a local etching of the type carried out in an attack contact on the rear surface is generally performed, but not necessarily, on a surface area corresponding to a plurality of neighboring wells 5 and 7. The number and the arrangement of detection circuits 33 are preferably selected according to the dimensions of wells 5 and 7, and thus to the spacing between insulating regions 25, to be able to detect all local etching types.

An advantage of the protection devices described in relation with FIGS. 3-5 is that they provide an increased security, since, in addition to detecting an attack by contact from the back side of the substrate, they enables to prevent any fault injection into the chip.

A simplified embodiment enabling to detect a local etching of the substrate from its back side, but which does not comprise the function of chip protection against fault injection, may be provided. In this case, N-type layer 23 extending under the wells may be omitted. Trenches 25 then cross wells 5 and 7 and directly emerge into substrate 3.

Specific embodiments of the present disclosure have been described. Various alterations, modifications and improvements will readily occur to those skilled in the art.

In particular, embodiments of an integrated circuit chip protected against laser attacks have been described hereabove, the chip comprising parallel wells of alternated conductivity types formed in the upper portion of a semiconductor substrate, the wells being separated from one another by insulating regions 25. The present disclosure is not limited to the specific example described hereabove in which the wells have, in top view, the shape of parallel strips. "Parallel wells" is here more generally used to designate neighboring wells arranged so that a surface of a first well is in front of a surface of the second well and substantially parallel to this surface. In the provided structure, an insulating trench 25, which may comprise interrupt areas, forms an interface between said substantially parallel surfaces.

Further, examples of integrated circuit chips formed from a P-type substrate have been described hereabove. It will be within the abilities of those skilled in the art to adapt the provided protection device to a chip formed from an N-type substrate.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit chip, comprising:
   first and second wells, of first and second conductivity types, respectively, formed in an upper portion of a semiconductor substrate of the first conductivity type; and
   a protection device configured to protect the integrated circuit chip against attacks and including:
      between the wells, a trench with insulated walls and filled with a conductive material, the trench extending from upper surfaces of the wells to a lower portion of the substrate below the wells; and
      a stray capacitance modification detector configured to detect a modification of a stray capacitance between said conductive material and a region of the chip.

2. The chip of claim 1, wherein said region is configured so that the stray capacitance is modified when the substrate is locally etched from a back side of the substrate.

3. The chip of claim 1, further comprising a layer of the second conductivity type, extending under said plurality of wells, between the wells and the lower portion of the substrate.

4. The chip of claim 1, wherein the trench has a depth greater than 2 μm.

5. The chip of claim 1, wherein the conductive material is polysilicon.

6. The chip of claim 1, wherein said stray capacitance modification detector comprises an oscillator having a resonance frequency depending on a value of said stray capacitance, and a comparator configured to compare said resonance frequency with a reference value.

7. The chip of claim 1, wherein said region is the lower portion of the substrate.

8. The chip of claim 1, wherein said region is a bias contact region of the first well.

9. The chip of claim 1, comprising:
 a first plurality of MOS transistors each having a channel of the second conductivity type formed in the first well; and
 a second plurality of MOS transistors each having a channel of the first conductivity type formed in the second well, the MOS transistors of second plurality being inverter-connected with corresponding MOS transistors of the first plurality.

10. A method of forming an integrated circuit chip, comprising:
 forming first and second wells, of first and second conductivity types, respectively, in an upper portion of a semiconductor substrate of the first conductivity type; and
 forming a protection device configured to protect the integrated circuit chip against attacks and including:
  forming, between the wells, a trench with insulated walls and filled with a conductive material, the trench extending from upper surfaces of the wells to a lower portion of the substrate below the wells; and
  forming a stray capacitance modification detector configured to detect a modification of a stray capacitance between said conductive material and a region of the chip.

11. The method of claim 10, wherein said region is configured so that the stray capacitance is modified when the substrate is locally etched from a back side of the substrate.

12. The method of claim 10, further comprising forming a layer of the second conductivity type, extending under said plurality of wells, between the wells and the lower portion of the substrate.

13. The method of claim 10, wherein forming said stray capacitance modification detector comprises forming an oscillator having a resonance frequency depending on a value of said stray capacitance, and a comparator configured to compare said resonance frequency with a reference value.

14. The method of claim 10, wherein said region is the lower portion of the substrate.

15. The method of claim 10, comprising:
 forming a first plurality of MOS transistors each having a channel of the second conductivity type formed in the first well; and
 forming a second plurality of MOS transistors each having a channel of the first conductivity type formed in the second well, the MOS transistors of second plurality being inverter-connected with corresponding MOS transistors of the first plurality.

16. A method of protecting an integrated circuit chip, comprising:
 detecting a modification of a stray capacitance between a conductive material and a region of the chip, the chip including first and second wells, of first and second conductivity types, respectively, in an upper portion of a semiconductor substrate of the first conductivity type; a trench with insulated walls and filled with a conductive material, the trench extending between the wells from upper surfaces of the wells to a lower portion of the substrate below the wells; and
 disabling the chip in response to detecting the modification of the stray capacitance.

17. The method of claim 16, wherein the detecting includes detecting the modification of the stray capacitance in response to the substrate being locally etched from a back side of the substrate.

18. The method of claim 16, wherein the detecting includes detecting a change in a resonance frequency of an oscillator having a terminal coupled to the conductive material filling the trench, the resonance frequency depending on a value of said stray capacitance.

19. The method of claim 18, wherein detecting the change in the resonance frequency includes using a counter to detect the resonance frequency, and comparing the resonance frequency detected by the counter to a stored value corresponding to a desired resonance frequency of the oscillator.

* * * * *